United States Patent [19]

Wolstenholme et al.

[11] Patent Number: 5,397,725
[45] Date of Patent: Mar. 14, 1995

[54] METHOD OF CONTROLLING OXIDE THINNING IN AN EPROM OR FLASH MEMORY ARRAY

[75] Inventors: Graham R. Wolstenholme, Boise, Id.; Albert Bergemont, San Jose, Calif.

[73] Assignee: National Semiconductor Corporation, Sunnyvale, Calif.

[21] Appl. No.: 144,677

[22] Filed: Oct. 28, 1993

[51] Int. Cl.⁶ .......................................... H01L 21/265
[52] U.S. Cl. ...................................... 437/43; 437/978; 437/49; 437/985; 257/316; 148/DIG. 43
[58] Field of Search .................. 437/43, 49, 191, 985, 437/978; 257/316; 148/DIG. 43

[56] References Cited

U.S. PATENT DOCUMENTS

| | | |
|---|---|---|
| 4,749,443 | 6/1988 | Mitchell et al. |
| 5,102,814 | 4/1992 | Woo ............................ 437/43 |
| 5,149,665 | 9/1992 | Lee .............................. 437/43 |
| 5,151,375 | 9/1992 | Kazerounian . |
| 5,204,835 | 4/1993 | Eitan . |
| 5,210,047 | 5/1993 | Woo et al. .................... 437/43 |
| 5,240,870 | 8/1993 | Bergemont . |

FOREIGN PATENT DOCUMENTS

| | | |
|---|---|---|
| 63-62382A | 3/1988 | Japan ........................... 437/43 |
| 2156586 | 10/1985 | United Kingdom . |

OTHER PUBLICATIONS

B. Eitan, R. Kazerounian and A. Bergemont, "Alternate Metal Virtual Ground (AMG)—A New Scaling Concept for Very High-Density EPROM's," *IEEE Electron Device Letters*, Aug. 1991, vol. 12, No. 8, pp. 450–452.

Primary Examiner—Olik Chaudhuri
Assistant Examiner—Richard A. Booth
Attorney, Agent, or Firm—Limbach & Limbach; H. Donald Nelson; Stephen R. Robinson

[57] ABSTRACT

A method of fabricating an electrically-programmable read-only-memory (EPROM) or a flash memory array structure that controls oxide thinning to prevent shorts in the array and trenching of the bit lines is provided. The method includes the following steps. First, in accordance with conventional processing techniques, layers of gate oxide, poly1, ONO, poly cap, and nitride are sequentially deposited on the substrate. Next, in accordance with the present invention, a layer of thin poly is deposited on the layer of nitride. The thin poly/nitride/poly cap/ONO/poly1 layers are then etched to define thin poly/nitride/poly cap/ONO/poly1 parallel strips. Edge oxide is then formed on the thin poly/nitride/poly cap/ONO/poly1 strips. Following this, a layer of spacer oxide is formed over the layer of edge oxide. An anisotropic etch back of the layers of spacer oxide and edge oxide is then performed until the thin poly layer and the substrate are exposed. Next, a N-type dopant is introduced into the substrate material between the thin poly/nitride/poly cap/ONO/poly1 strips to define the N+ buried bit lines of the array. Optionally, a thin layer of edge oxide can be formed over the substrate prior to the introduction of the dopant. Following the formation of the buried bit lines, a layer of differential oxide is grown over the above-described structure and the process then continues according to conventional steps.

9 Claims, 11 Drawing Sheets

METHOD OF CONTROLLING OXIDE THINNING IN AN EPROM OR FLASH MEMORY ARRAY

BACKGROUND OF THE INVENTION

1. Field of the Invention

The present invention relates to the fabrication of electrically-programmable read-only-memories (EPROMs) and "flash" memories and, in particular, to a method of controlling oxide thinning in the fabrication of an EPROM or flash array to prevent electrical shorts in the array and trenching of the bit line.

2. Description of the Related Art

An electrically-programmable read-only-memory (EPROM) and a "flash" memory are non-volatile memories which maintain data stored in the memory when power is removed. EPROM devices are erased by exposure to ultraviolet light. Flash memories add electrical erasure and reprogramming functionality to the non-volatility of the EPROM.

A virtual-ground, buried-bit line, EPROM or flash array are increased-density memories that realize the increased density by reducing the number of electrical contacts which are required by the array. In contrast with a conventional array, which forms a bit line contact for every two cells, the virtual-ground array forms a bit line contact for a larger number of cells, typically ranging from 16 to 64 cells.

FIG. 1 shows a plan diagram that illustrates a representation of a virtual-ground EPROM or flash array 10. As shown in FIG. 1, array 10 includes a number of columns of buried bit lines BL1-BLn which alternately represent the drain and the source of the memory cells 14 of array 10. Array 10 also includes a number of word lines WL1-WLn which orthogonally intersect each of the buried bit lines BL1-BLn. Finally, electrical contacts 18 are formed on each end of the buried bit lines BL1-BLn. Thus, the electrical contacts form a bit line contact for every n cells.

FIGS. 2A-2H show a cross-sectional diagram taken along lines 2A—2A of FIG. 1 that illustrates a process flow for the fabrication of the virtual ground, buried bit line array 10. As shown in FIG. 2A, the array is conventionally fabricated by first forming a layer of gate oxide 22 on a P-type silicon substrate 20. This is followed by the deposition of a layer of polysilicon (poly1) 24 and the formation of an overlying layer of oxide-nitride-oxide (ONO) 26. Next, an ONO/poly1 mask is formed over the layer of ONO 26 and patterned to define rows of ONO/poly1 strips 28. The unmasked layer of ONO 26 and the corresponding underlying layer of poly1 24 are then etched until the underlying layer of gate oxide 22 is exposed.

Referring to FIG. 2B, after the rows of ONO/poly1 strips 28 have been formed, arsenic is implanted to define the N+ buried bit lines 30 of the virtual-ground array. Following this, the ONO/poly1 mask is stripped, and a thin layer of edge oxide 32 is grown on each ONO/poly1 strip 28 and the exposed layer of gate oxide 22 between the rows of ONO/poly1 strips 28. As shown in FIG. 2B and as well known in the art, substantially no edge oxide 32 is grown on the layer of ONO 26 due to the lack of an oxidizing material.

Referring to FIG. 2C, once the thin layer of edge oxide 32 has been formed, a layer of differential oxide 34 is grown over the layer of edge oxide 32. As with the layer of edge oxide 32, substantially no differential oxide 34 is grown over the layer of ONO 26.

As shown in FIG. 2C, two problems arise from the formation of the layer of differential oxide 34. First, the structural stress which is present at the corners of semiconductor devices causes oxide thinning to occur which results in the formation of recesses 36. Second, oxide wedges 38 are formed as a result of the oxidation of a portion of the layer of poly1 24 at the outer boundary between the layers of poly1 24 and ONO 26.

As described in greater detail below, the recesses 36 and the oxide wedges 38 in turn cause the formation of poly2 remnants and poly1 stringers, respectively. The poly2 remnants may cause word line to word line shorts while the poly1 stringers may cause poly1 floating gate to poly1 floating gate shorts. Further, the recesses 36 define the minimum thickness of the layer of differential oxide 34 that is formed over the N+ buried bit lines 30. Thus, as also described in greater detail below, the recesses 36 can cause portions of the N+ buried bit lines 30 to be trenched in subsequent etching steps.

Referring to FIG. 2D, after the layer of differential oxide 34 has been formed, a second layer of polysilicon (poly2) 40 is deposited on the layer of differential oxide 34. Once the layer of poly2 40 has been deposited, the word lines WL1-WLn of FIG. 1 are formed.

FIG. 3 shows a perspective view taken between lines 3A—3A and lines 3AA—3AA of FIG. 1 that illustrates the ideal formation of word lines WL1 and WL2. As shown in FIGS. 1, 2, and 3, the word lines WL1 and WL2 are ideally formed by removing the layers of poly2 40, ONO 26, and poly1 24 that have been formed in the regions 42 between the word lines WL1 and WL2.

Referring again to FIG. 2D, after the layer of poly2 40 has been deposited, a poly2 mask (not shown) is formed on the array to define the word lines. Once the poly2 mask has been formed, the unmasked areas of the layer of poly2 40 are anisotropically etched until the layers of differential oxide 34 and ONO 26 are exposed. The etching chemistries which are typically utilized to etch poly2 have a high-selectivity with respect to differential oxide and ONO. Thus, when the layer of poly2 40 is etched, the layers of differential oxide 34 and ONO 26 remain substantially intact.

Referring to FIG. 2E, since the anisotropic etch is essentially a vertical etch, poly2 remnants 44 are formed in the recesses 36 because a portion 46 of the layer of differential oxide 34 effectively functions as a mask. As stated above and as shown in FIG. 4, the poly2 remnants 44 can cause shorts between adjacent poly2 word lines such as word lines WL1 and WL2.

After the layer of poly2 40 has been removed, the layer of ONO 26 and the minimal layers of differential oxide 34 and edge oxide 32 are etched with an etching chemistry which typically has a relatively high-selectivity between the remaining layer of poly and the layers of differential oxide 34, edge oxide 32, and ONO 26.

As shown in FIG. 2F, to prevent this etching step from exposing a portion of the N+ buried bit lines 30 and subsequently removing a portion of the N+ buried bit lines 30 during the following poly1 etch step, the minimum thickness R of the combined layers of differential oxide 34 and edge oxide 32, as shown in FIG. 2E, must be greater than the combined thickness T of the layer of ONO 26 and an oxide wedge 38.

As shown in FIGS. 2G and 5, the principal disadvantage of failing to remove the oxide wedges 38 is the formation of poly1 stringers 48 which, as stated above, also can result in shorts between the poly1 floating gates of adjacent memory cells 14. After the layers of differential oxide 34, edge oxide 32, and ONO 26 have been removed, the layer of poly1 is removed with an anisotropic etch.

As stated above, since the polysilicon etching chemistries are highly selective with respect to oxides, if the oxide wedges 38 are not removed with the previous etching step, the oxide wedges 38 function as masks which prevent the poly1 anisotropic etch from removing the poly1 material which lies below the oxide wedges 38. Thus, as shown in FIG. 2E, the minimum thickness R of the combined layers of differential oxide 34 and edge oxide 32 must be greater than the combined thickness T of the oxide wedges 38 and the layers of differential oxide 34, edge oxide 32 and ONO 26.

Based on the above, it would appear that the problems presented by oxide thinning can be simply solved by merely insuring that the combined thickness R is greater than the combined thickness T. Referring to FIG. 2H, the problem with this approach, however, is that the oxidation process which is utilized to form the layer of differential oxide 34 also diffuses the N+ buried bit lines 30, thereby reducing the channel length CL of the resulting memory cells. Thus, if the differential oxide fabrication time is extended to insure that the thickness R is greater than the thickness T, the channel lengths CL of the resulting memory cells are substantially reduced.

Therefore, there is a need for an EPROM/flash fabrication process which eliminates oxide thinning, thereby eliminating the formation of the poly2 remnants, and increasing the thickness R of the combined layers of differential oxide 34 and edge oxide 32 without reducing the channel length of the memory cells, which, in turn, would allow the oxide wedges to be removed without etching away a portion of the N+ buried bit lines 30.

SUMMARY OF THE INVENTION

The present invention provides a method of fabricating an electrically-programmable read-only-memory (EPROM) or a flash memory array that controls oxide thinning to prevent electrical shorts in the array and to prevent trenching of the bit lines. The method begins with the following steps. First, a layer of gate oxide is formed on a silicon substrate of P-type conductivity. This is followed by the formation of a layer of first polysilicon (poly1) on the layer of gate oxide. Next, a layer of oxide-nitride-oxide (ONO) is formed on the layer of poly1. Following this, a layer of second polysilicon (poly cap) is formed on the layer of ONO. After the poly cap layer has been formed, a layer of nitride is formed on the poly cap layer. Next, in accordance with the present invention, a layer of third polysilicon (thin poly) is deposited on the layer of nitride. The thin poly/nitride/poly cap/ONO/poly1 layers are then etched to define rows of parallel thin poly/nitride/poly cap/ONO/poly1 strips which, in turn, inherently define parallel strips of gate oxide material therebetween. Next, spacers are formed on the sidewalls of the parallel strips. The spacers are formed by forming a layer of edge oxide on the thin poly/nitride/poly cap/ONO/poly1 strips and the exposed layer of gate oxide therebetween. Following this, a layer of spacer oxide is formed on the layer of edge oxide. The spacer oxide can be, for example, a conformally deposited oxide such as low-pressure chemically-vapor-deposited oxide. The spacers are then formed by etching the layer of spacer oxide and the layer of edge oxide until both the substrate and the thin poly layer are exposed. An N-type dopant is then introduced into the parallel strips of substrate material to define the N+ buried bit lines of the EPROM or flash array. Optionally, a thin layer of oxide can be formed on the substrate material prior to the introduction of the dopant material. After the dopant is introduced, a layer of differential oxide is formed over the structure resulting from the above-listed steps. After this, the process continues with conventional steps.

The formation of spacers according to the above described method provides a technique for eliminating the poly2 remnants and the poly1 stringers as discussed above. In addition, since the N+ bit line implant is formed after the formation of the spacers, adjoining bit lines are initially formed farther apart. This allows a thicker layer of differential oxide to be formed without reducing the size of the channel length due to N+ diffusion, and incidentally provides a means for controlling the size of the channel length.

A better understanding of the features and advantages of the present invention will be obtained by reference to the following detailed description and the accompanying drawings which set forth an illustrative embodiment in which the principals in the invention are utilized.

DETAILED DESCRIPTION

FIGS. 6A–6F show a cross-sectional diagram that illustrates a process flow for fabricating a virtual ground, buried bit line EPROM or flash array that, in accordance with the concepts of the present invention, reduces the formation of the oxide wedges in the floating gate and eliminates the formation of the recesses in the layer of differential oxide. As stated above, by reducing the formation of oxide wedges, the likelihood of floating gate to floating gates shorts can be reduced. In addition, by eliminating the recesses, the problem of word line to word line shorts, as well as bit line trenching, can be eliminated.

Figure 1:
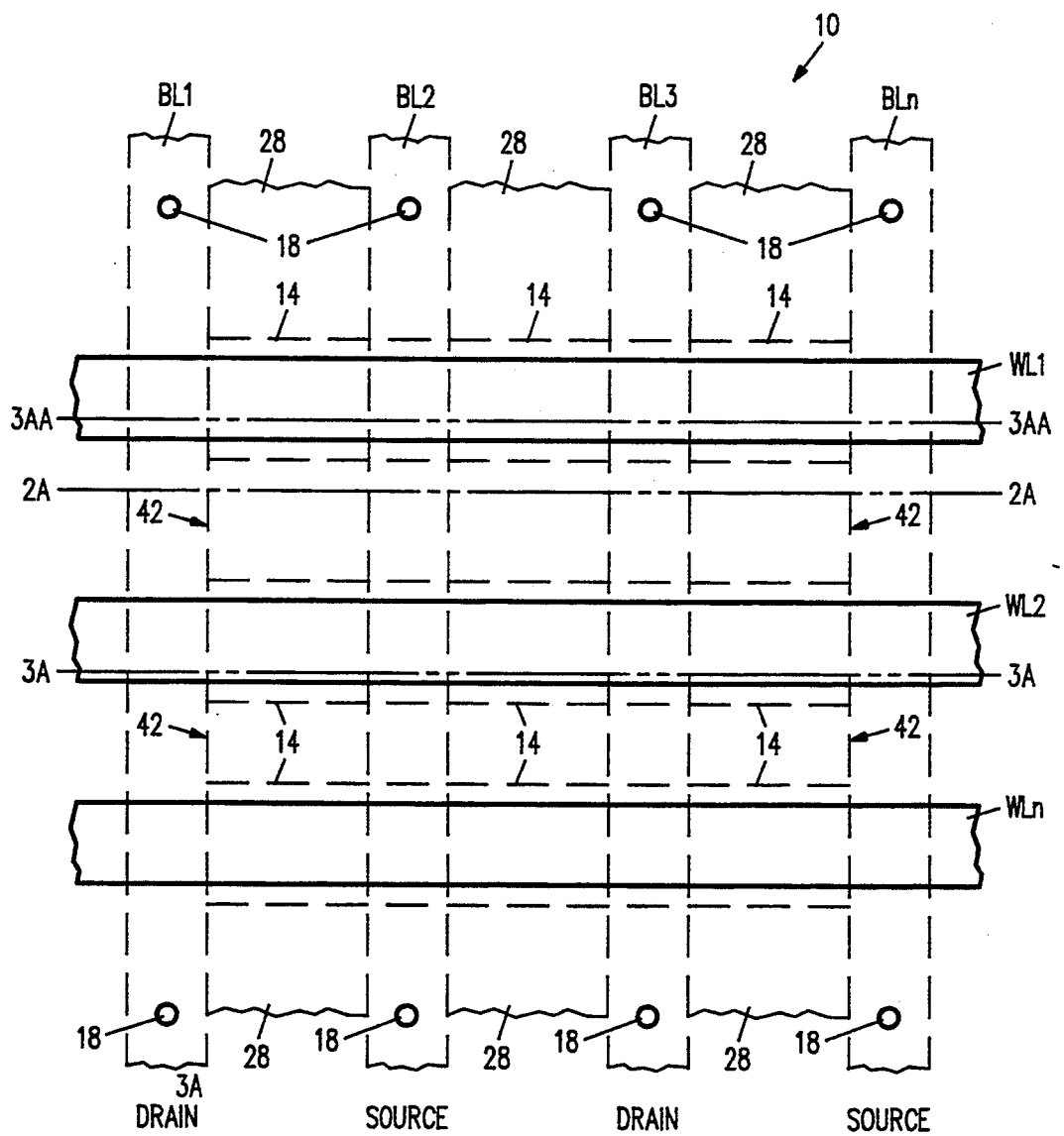
FIG. 1 is a plan diagram illustrating a portion of a conventional virtual-ground EPROM or flash array 10.
Figure 2A:
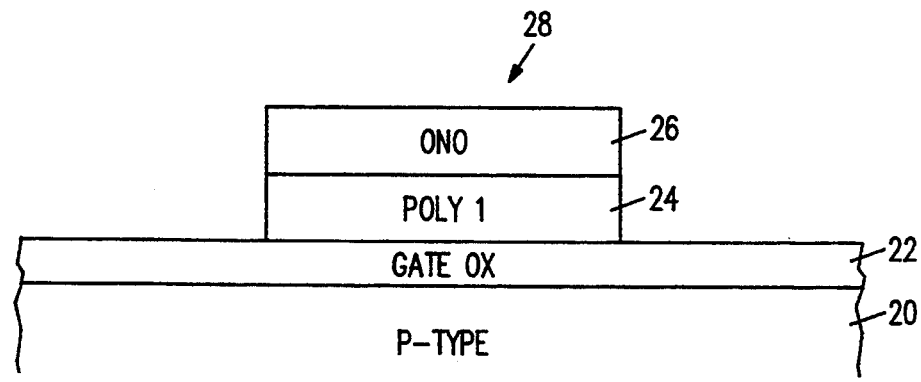
FIGS. 2A–2H are a cross-sectional diagram taken along lines 2A—2A of FIG. 1 illustrating a process flow for the fabrication of the virtual ground, buried bit line array 10.
Figure 2B:
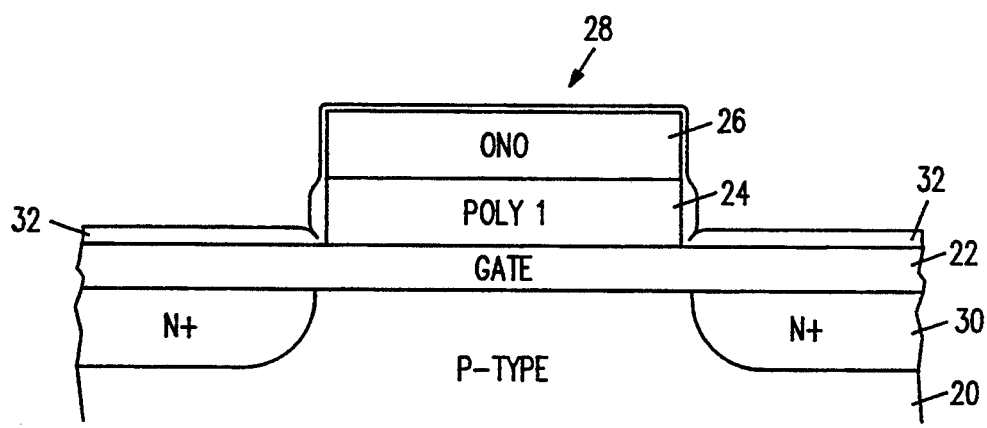
Figure 2C:
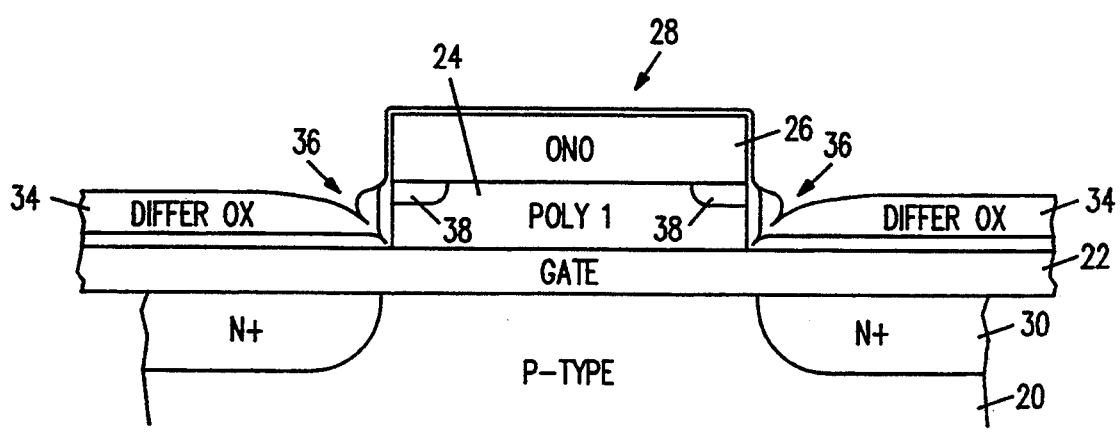
Figure 2D:
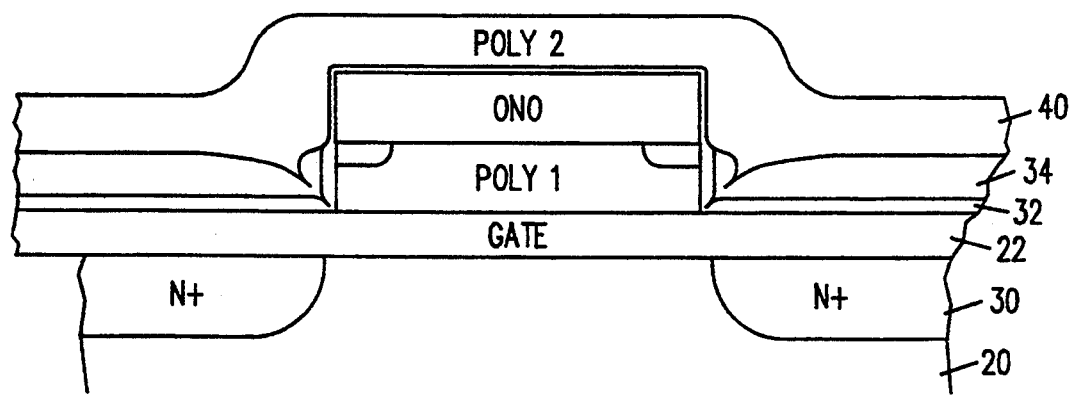
Figure 2E:
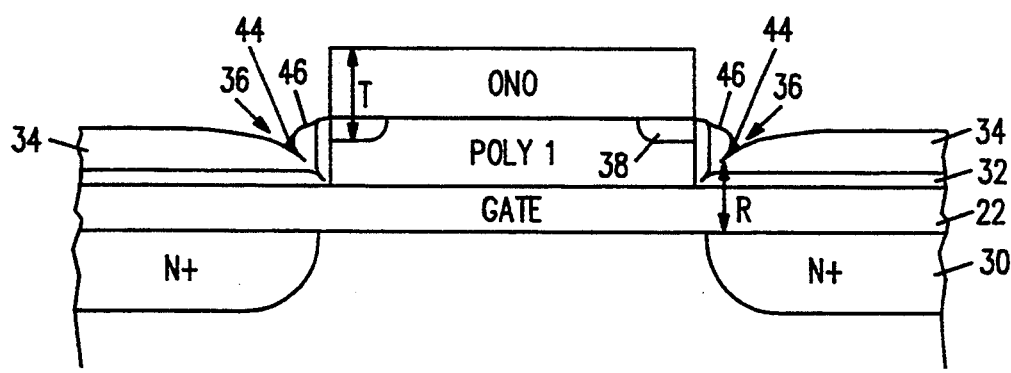
Figure 2F:
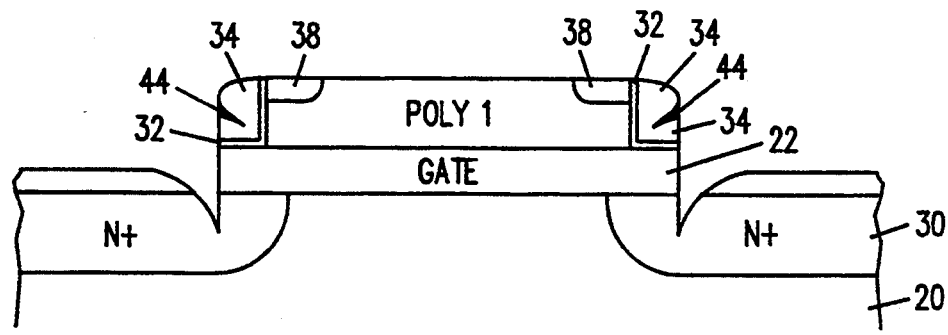
Figure 2G:
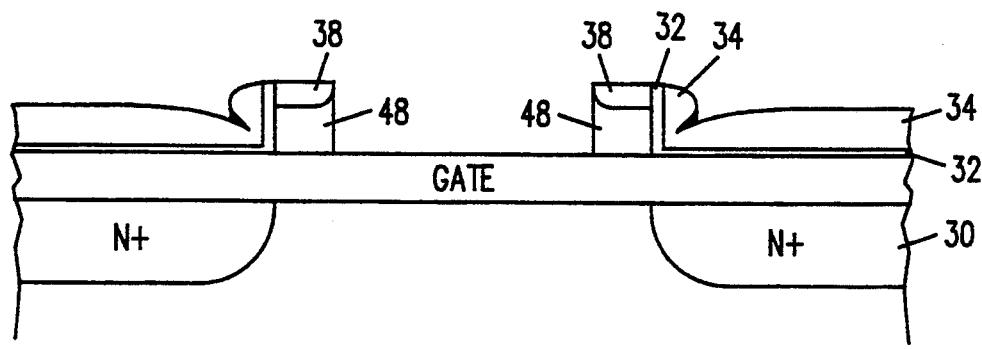
Figure 2H:
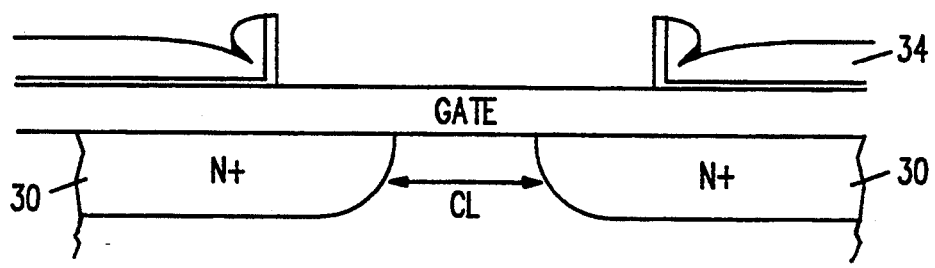
Figure 3:
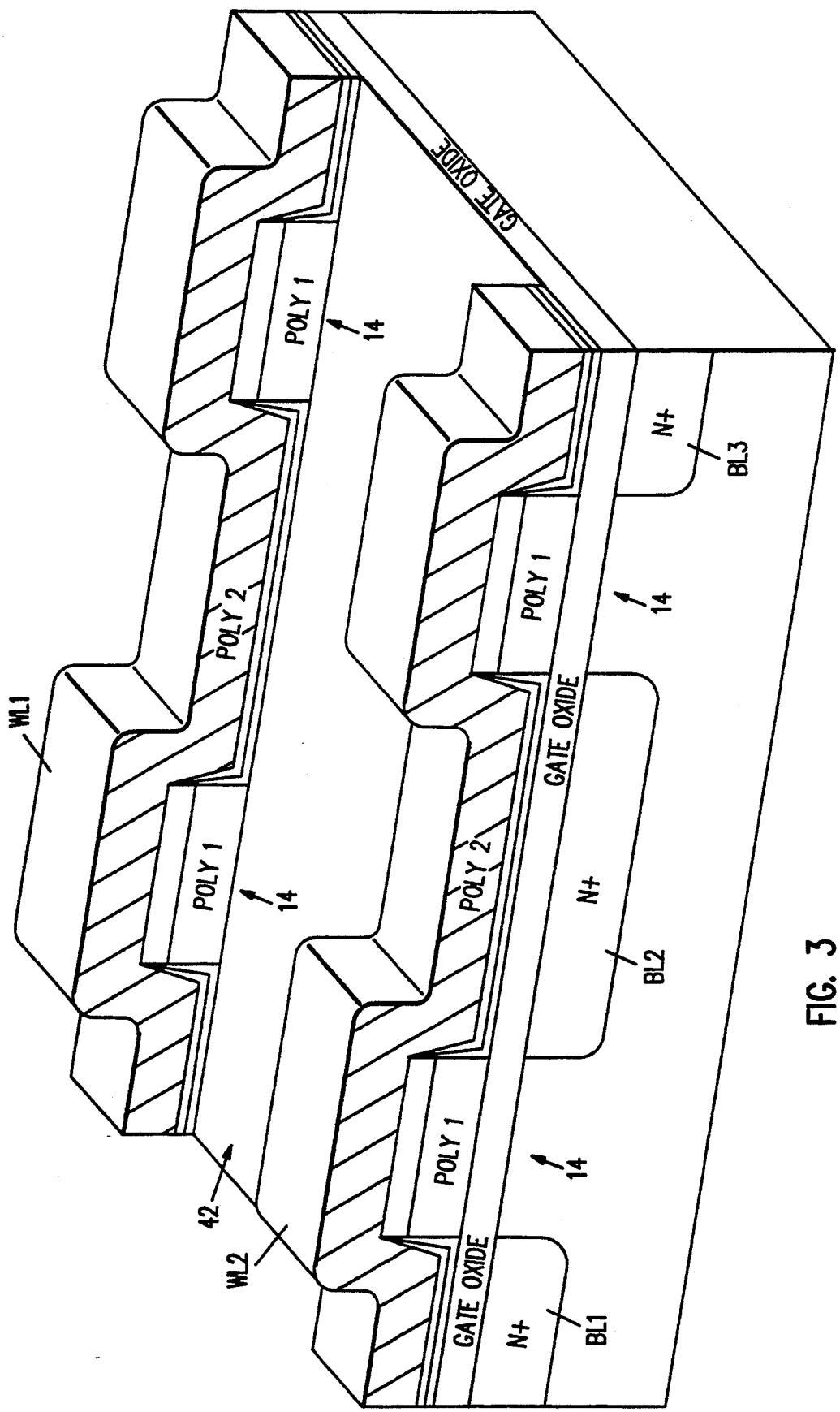
FIG. 3 is a perspective view taken between lines 3A—3A and 3AA—3AA of FIG. 1 illustrating the formation of the word lines WL1-WLn of FIG. 1.
Figure 4:
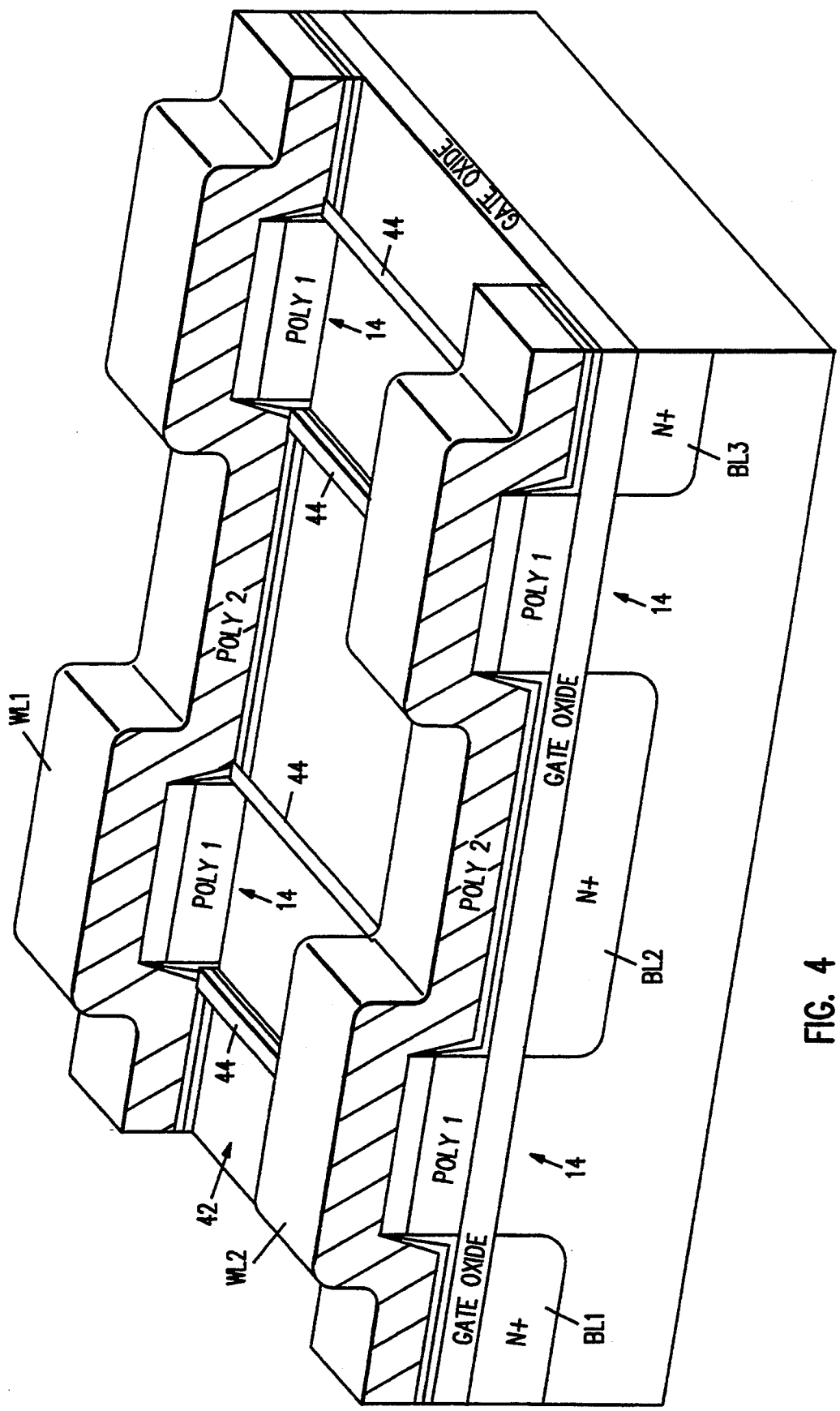
FIG. 4 is a perspective view of a portion of array 10 illustrating a word line-to-word line short resulting from remnant 44.
Figure 5:
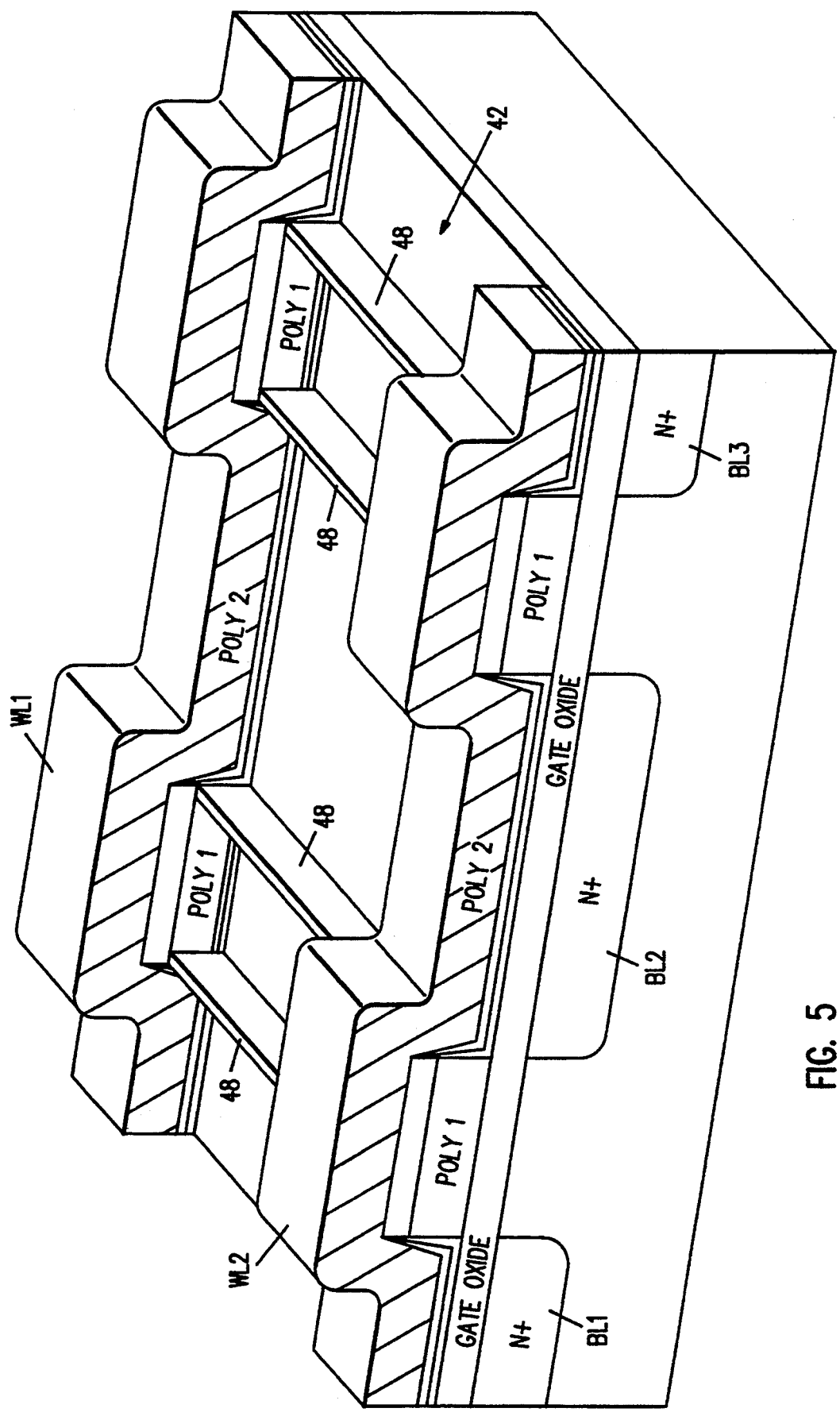
FIG. 5 is a perspective view of a portion of array 10 illustrating a floating gate-to-floating gate short between adjacent memory cells 14.
Figure 6A:
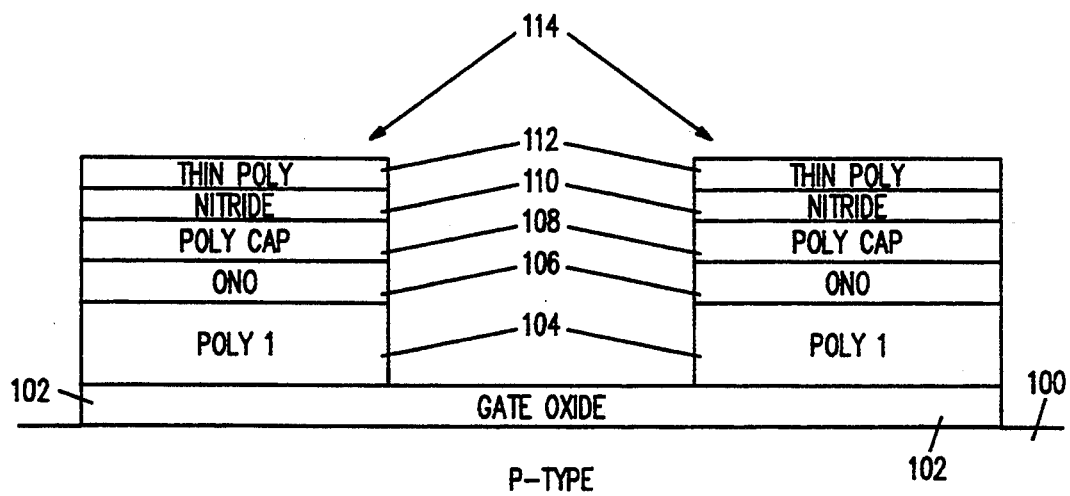
FIGS. 6A–6F are cross-sectional diagrams illustrating a process flow for fabricating a virtual ground, buried bit line EPROM or flash array that, in accordance with the concepts of the present invention, reduces the oxide thinning during the formation of the layer of differential oxide.

Referring to FIG. 6A, the process initially begins by growing a layer of gate oxide 102 approximately 100–200 Å thick on an underlying P-type substrate 100. Next, a layer of polysilicon (poly1) 104, which has been doped to an appropriate conductivity, is deposited on the layer of gate oxide 102, approximately 2000 Å thick. Following this, a layer of oxide-nitride-oxide (ONO) 106 approximately 250 Å thick is formed on the layer of poly1 104.

After the layer of ONO 106 has been formed, a second layer of polysilicon (poly cap) 108 is deposited on the layer of ONO 106 with a thickness of approximately 1000 Å. Following this, a layer of nitride 110 approximately 100 Å thick is formed on the poly cap 108 to prevent oxidation of the poly cap 108. Next, in accordance with the present invention, a third layer of polysilicon (thin poly) 112 approximately 100–200 Å thick is deposited on the layer of nitride 110 to provide an etch stop during the subsequent etch of a layer of conformally deposited oxide.

Once the thin poly layer 112 has been deposited, a poly1 mask (not shown) is formed on the thin poly layer 112 to define rows of parallel strips 114. The poly1 mask is formed by utilizing conventional photoresist formation, photolithographic exposure, development and removal techniques. As shown in FIG. 6A, after the poly1 mask has been formed, the rows of parallel strips 114 are formed by anisotropically etching the unmasked areas until the layer of gate oxide 102 is exposed.

Figure 6B:
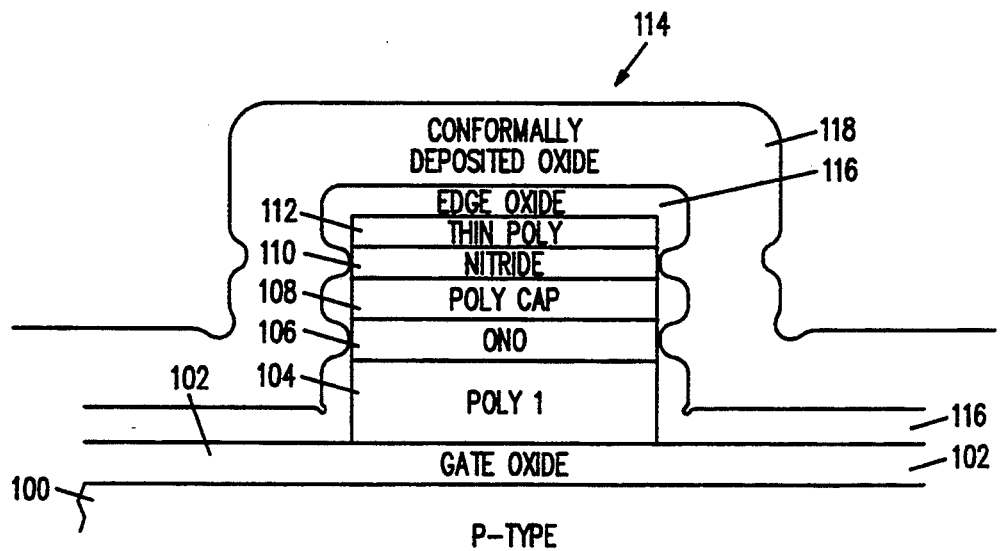

Referring to FIG. 6B, once the rows of parallel strips 114 have been formed, the poly1 mask is stripped. Next, a layer of edge oxide 116 approximately 200 Å thick is grown by oxidizing both the rows of parallel strips 114 and the exposed layer of gate oxide 102 between the rows of parallel strips 114. Since, as stated above, the thin poly layer 112 is formed to provide a subsequent etch stop, the thin poly layer 112 must have a minimum thickness which insures that a functional etch stop will remain once the thin poly layer 112 has been partially oxidized during the formation of the layer of edge oxide 116. Further, as shown in FIG. 6B and as is well known in the art, substantially no edge oxide grows on the layer of nitride 110 or the layer of ONO 106.

After the layer of edge oxide 116 has been grown, a layer of low-pressure chemically-vapor-deposited (LPCVD) oxide 118, such as a silane-based oxide, is conformally deposited on the layer of edge oxide 116 with a thickness of about 1000 Å.

Figure 6C:
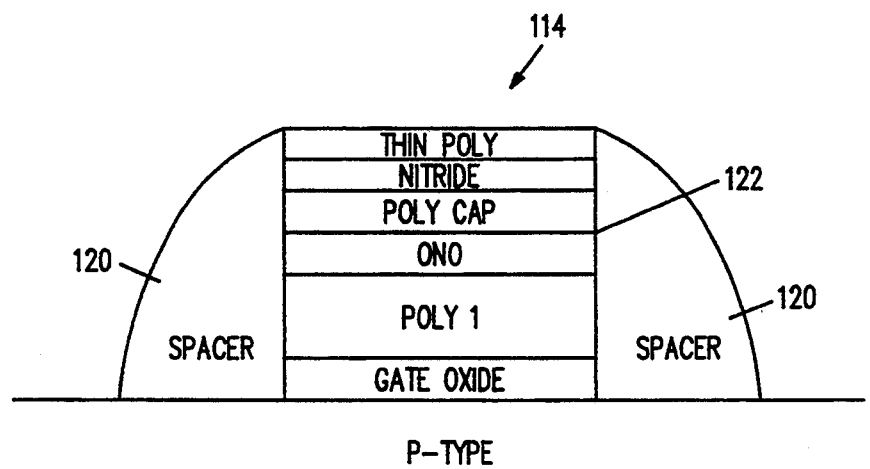
Figure 6D:
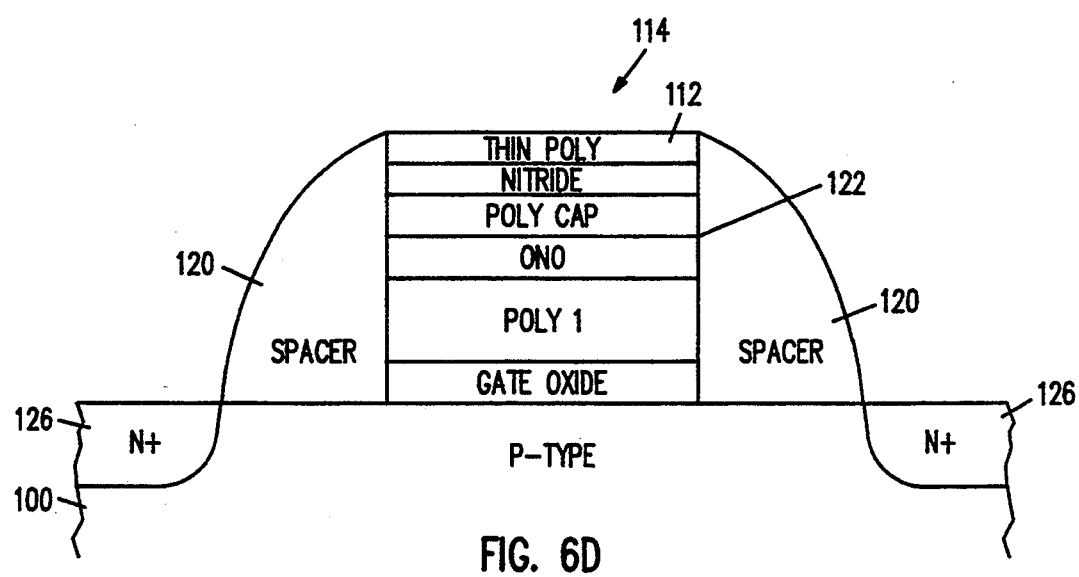

Referring to FIG. 6C, after the layer of LPCVD oxide has been deposited, spacers 120 are formed on the sidewalls 122 of each parallel strip 114. As shown in FIG. 6C, the spacers 120 are formed by anisotropically etching the layer of LPCVD oxide and the layer of edge oxide 116 until both the substrate 100 and the thin poly layer 112 are exposed. As shown in FIG. 6D, once the spacers 120 have been formed, arsenic or a similar dopant is implanted to define the N+ buried bit lines 126.

Optionally, a thin layer of edge oxide (not shown) can be formed on the substrate 100 and the thin poly layer 112 prior to implanting the dopant to define the N+ buried bit lines 126. The thin layer of edge oxide formed over the substrate 100 acts to protect the substrate during the implant process.

Figure 6E:
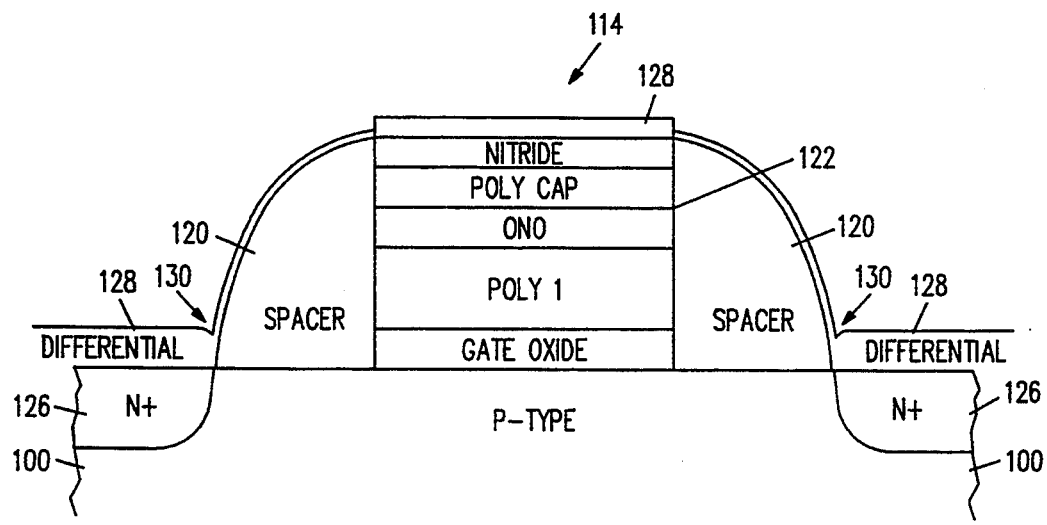

Referring to FIG. 6E, after the N+ buried bit lines 126 have been formed, the resulting structure is oxidized to form a layer of differential oxide 128 on the parallel strips 114 and the substrate 110. The remaining portion of the thin poly layer 112 is completely consumed during this oxidation step while a layer of differential oxide 128 approximately 800 Å thick is formed on the substrate 100. As with the first oxidation step after spacer formation, substantially no differential oxide grows on the spacers 120.

Figure 6F:
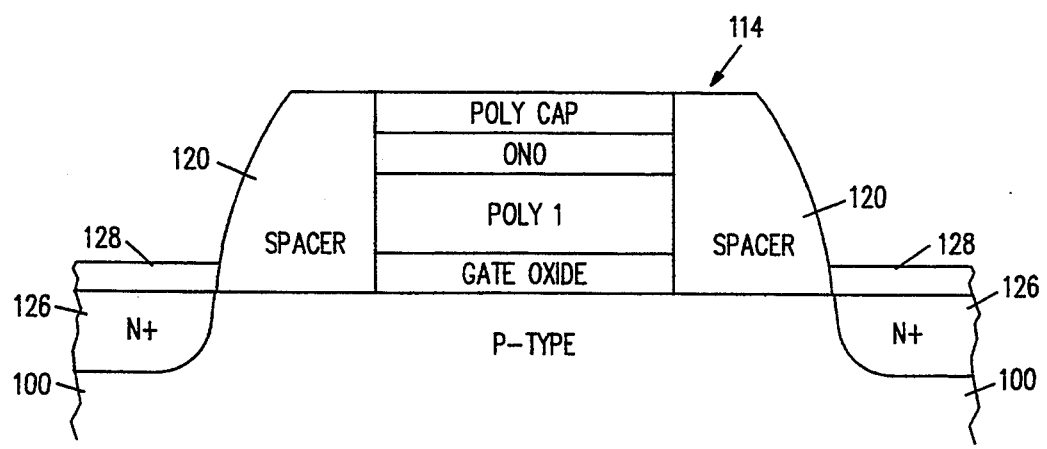

Referring to FIG. 6F, following the formation of the layer of differential oxide 128, the resulting structure is etched until the oxidized layer of thin poly and the layer of nitride 110 are removed. As a result of this etching step, the thickness of the layer of differential oxide 128 over the N+ buried bit lines 126 is also reduced.

Next, a second layer of polysilicon (not shown) is deposited. The second layer of polysilicon is then masked and etched to form the word line (not shown). The resulting polysilicon word line is then used as a self-aligned mask to define the final structure.

The advantages of the present invention are apparent from FIG. 6E. First, although recesses 130 are formed in this process as well, the structural stress that is present with the curved shape of the spacers 120 as well as the uniform growth of differential oxide on the substrate 100 causes relatively minor recesses to be formed which are completely accessible by an anisotropic etch.

Thus, when the word lines are subsequently formed by the deposition and etch of a fourth layer of polysilicon (poly2), the poly2 remnants, as described above, will be completely removed, thereby eliminating the potential for shorts between adjacent word lines.

Second, by forming spacers 120 which completely cover the boundaries between the layer of ONO 106 and the layers of poly cap 108 and poly1 104 as well as the boundary between the layer of poly cap 108 and the layer of nitride 110, the oxide wedges, as described above, can be substantially reduced in size. Thus, with the process of the present invention, only minimal oxide wedges are formed during the formation of the layer of edge oxide.

Third, although the minimum thickness of the layer of differential oxide 128 formed over the N+ buried bit lines 126 must now be greater than the combined layers of ONO 106, nitride 110, and differential oxide 128 (resulting from the consumption of the thin poly layer 112), there is no longer a problem with extending the fabrication time of the differential oxide layer 128 because the N+ buried bit lines 126 are initially formed farther apart than was the case with the prior art. Thus, in addition to providing a means for growing a thicker layer of differential oxide over the buried bit lines 126, the process of the present invention also provides control over the channel lengths of the resulting memory cells.

Figure 7:
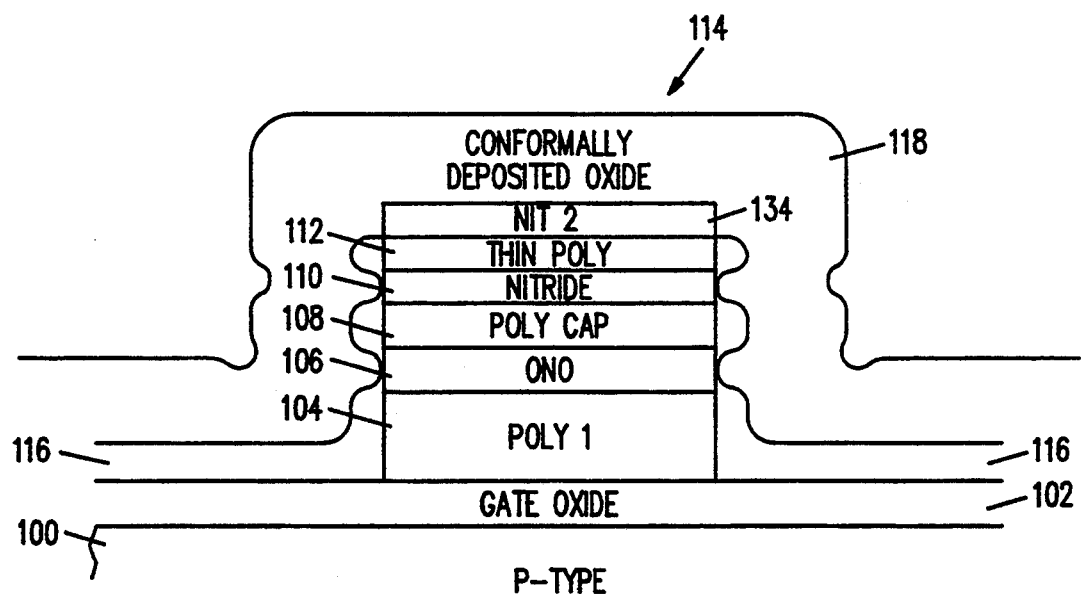
FIG. 7 is a cross-sectional diagram illustrating a first alternative embodiment of the present invention.

FIG. 7 shows a cross-sectional diagram that illustrates a first alternative embodiment of the present invention. As shown in FIG. 7, after the layer of thin poly 112 has been deposited, a second layer of nitride (nit2) 134 can be formed on the layer of thin poly 112. Following this, the process continues as described above. The nit2 layer 134 is then removed at the same time the LPCVD oxide 118 and the edge oxide 116 are etched back to form the spacers 120.

The advantage of the nit2 layer 134 is that the nit2 layer 134 will prevent the partial oxidation of the thin poly layer 112 when the layer of edge oxide 116 is subsequently formed. By preventing the partial oxidation of the thin poly layer 112, an even thinner layer of thin poly 112 can be deposited to form the etch stop.

It should be understood that various alternatives to the embodiments of the invention described herein and maybe employed in practicing the invention. It is intended that the following claims define the scope of the invention, that methods and apparatus within the scope of these claims be covered thereby.

What is claimed is:

1. A method of fabricating a memory device structure to control oxide thinning between the word lines and the buried bit lines of the structure, the method comprising the steps of:

forming a layer of gate oxide on a silicon substrate of P-type conductivity;

forming a first layer of polysilicon on the layer of gate oxide;

forming a layer of oxide-nitride-oxide on the first layer of polysilicon;

forming a second layer of polysilicon on the layer of oxide-nitride-oxide;

forming a first layer of nitride on the second layer of polysilicon;

forming a third layer of polysilicon on the first layer of nitride;

etching the third layer of polysilicon, the first layer of nitride, the second layer of polysilicon, the layer of oxide-nitride-oxide, and the first layer of polysilicon to form a plurality of parallel spaced-apart strips, each pair of adjacent parallel spaced-apart strips defining a strip of gate oxide material therebetween, each parallel spaced-apart strip having sidewalls;

forming a layer of spacer oxide on the parallel spaced-apart strips and the strip of gate oxide material defined between each pair of adjacent parallel spaced-apart strips; and etching the layer of spacer oxide to form spacers along the sidewalls of each parallel spaced-apart strip.

2. The method of claim 1 and further comprising the step of:

forming a second layer of nitride on the third layer of polysilicon after the formation of the third layer of polysilicon.

3. The method of claim 1 wherein the spacer oxide is a low-pressure chemically-vapor-deposited oxide.

4. The method of claim 3 wherein the low-pressure chemically-vapor-deposited oxide is conformally deposited.

5. The method of claim 1 and further comprising the step of:

forming N+ buried bit lines after formation of the spacers by introducing N-type dopant through the gate oxide material formed between each pair of adjacent parallel spaced-apart strips into the substrate.

6. The method of claim 5 and further comprising the step of:

forming a layer of edge oxide on the parallel spaced-apart strips and the gate oxide material defined between each pair of adjacent parallel spaced-apart strips prior to formation of the layer of spacer oxide.

7. The method of claim 1 and further comprising the step of:

forming a first layer of edge oxide on the parallel spaced-apart strips and the gate oxide material defined between each pair of adjacent parallel spaced-apart strips prior to formation of the layer of spacer oxide.

8. The method of claim 5 wherein the N-type dopant is implanted.

9. The method of claim 7 and further comprising the step of:

forming a second layer of edge oxide after the layer of spacer oxide and the first layer of edge oxide have been etched to form spacers.

* * * * *